United States Patent [19]

Barr et al.

[11] Patent Number: 5,677,091
[45] Date of Patent: Oct. 14, 1997

[54] LITHOGRAPHIC PRINT BIAS/OVERLAY TARGET AND APPLIED METROLOGY

[75] Inventors: Roger Lawrence Barr, Milton; Patrick J. Couillard, Jericho, both of Vt.

[73] Assignee: International Business Machines Corporation, Armonk, N.Y.

[21] Appl. No.: 646,463

[22] Filed: May 8, 1996

Related U.S. Application Data

[62] Division of Ser. No. 333,110, Nov. 1, 1994.

[51] Int. Cl.$^6$ ............................ H01L 21/30; G03F 1/00
[52] U.S. Cl. ........................... 430/5; 430/22; 430/30; 356/400; 356/401
[58] Field of Search ........................ 430/5, 20, 22; 356/401, 400

[56] References Cited

U.S. PATENT DOCUMENTS

| | | | |
|---|---|---|---|
| 4,433,911 | 2/1984 | Sawada et al. | 355/125 |
| 4,496,971 | 1/1985 | West et al. | 358/106 |
| 4,758,094 | 7/1988 | Wihl et al. | 356/394 |
| 5,296,917 | 3/1994 | Kusonose et al. | 356/401 |
| 5,300,786 | 4/1994 | Brunner et al. | 356/401 |
| 5,362,585 | 11/1994 | Adams | 430/30 |

FOREIGN PATENT DOCUMENTS

| | | | |
|---|---|---|---|
| 62-115830 | 5/1987 | Japan | 430/30 |
| 1-24251 | 1/1989 | Japan | 430/30 |
| 1-278018 | 11/1989 | Japan | 430/30 |
| 02-246313 | 10/1990 | Japan . | |

OTHER PUBLICATIONS

Ohtsuka, H., Abe, K. and Itoh, Y., "Quantitative Evaluation Method at Conjugate Point for Practical Resolution of Wafer Stepper", SPIE, vol. 1088 Optical/Laser Microlithography II, 1989, pp. 124–132.

*Primary Examiner*—Martin Angebranndt
*Attorney, Agent, or Firm*—Heslin & Rothenberg, P.C.; Wayne F. Reinke, Esq.

[57] ABSTRACT

A print bias target is imaged in a single layer of light-sensitive material. The print bias target is made up of a pair of concentric geometric shapes in which a plurality of target regions forms a plurality of isolated edges. Each target region is of a different image structure than each other target region immediately adjacent thereto. The positioning of a given isolated edge in the print bias target is determined relative to a corresponding isolated edge in the design image from which the print bias target was imaged. Focus setting and/or exposure setting for a lithographic system to minimize print bias may be determined using print bias information obtained from a print bias target matrix of varying exposure and focus. An imaging aberration may also be identified using print bias information from a print bias target matrix, such as lithographic astigmatism, lithographic coma and vibration. A slope of an imaging profile may also be determined from print bias information. Overlay may be determined by imaging a print bias target on top of a prior level image to create an overlay target, determining a center of the prior level image, determining an average center of the print bias target and determining a location of the average center relative to the prior level image center, thereby determining the overlay.

1 Claim, 15 Drawing Sheets

PRINT BIAS TARGET

NONE

ASTIGMATISM

COMA

VIBRATION

LITHOGRAPHIC PRINT BIAS/OVERLAY TARGET AND APPLIED METROLOGY

This application is a division of application Ser. No. 08/333,110 filed Nov. 1, 1994 which application is now pending.

BACKGROUND OF THE INVENTION

1. Technical Field

The present invention generally relates to lithography. More particularly, the present invention relates to determining the performance of a lithographic system.

2. Background Art

Lithographic processes for imaging semiconductor devices on wafers generally include an overlay process whereby the quality of the lithographic tool is tested by determining the quality of registration or alignment of one lithographic level to another. In the simplest form, the overlay process consists of attempting to image an upper-level image on top of a lower-level image such that the two images are centered relative to one another, and determining how well such centering is accomplished by determining a degree of offset for the centers of the upper and lower images. The overlay measurement is accomplished by an overlay measurement system detecting what are known as "isolated edges"; that is, a boundary between two different image structures, such as a section that has been developed away and a resist section that has not been developed away. An isolated edge is one that can be easily detected by the overlay measurement system, meaning that the distance between two edges forming a line is significantly above the resolution limit of the measurement device so that the edges are not influencing one another.

In addition to overlay, other "tests" utilizing tools other than an overlay measurement tool are performed to determine the quality of imaging with respect to a particular lithographic system. For example, other procedures not based on the determination of isolated edges exist for determining print bias, determining the best focus and/or best exposure for a given lithographic system, determining imaging aberrations and determining the slope of an imaging profile. Thus, while all of these different tests provide useful information for ensuring high-quality imaging, the time needed and the different tools required for performing all of the tests becomes prohibitive in terms of the time it takes to run the tests and the cost of the different equipment. Manufacturers may therefore be forced to minimize the testing of semiconductor devices, thus leading to a larger number of defects.

Thus, a need exists for a way to perform several different tests to determine imaging quality of a lithographic system without having to use many different tools and gathering many types of different data.

SUMMARY OF THE INVENTION

Briefly, the present invention satisfies the need for a way to perform several different types of lithographic quality tests without the need for many different types of tools and data by utilizing existing overlay measurement tools and the isolated edge information determined thereby to perform the various tests necessary to properly characterize lithographic image quality.

In accordance with the above, it is an object of the present invention to decrease the number of different tools presently used to perform various types of tests to determine image quality in a lithographic system.

It is another object of the present invention to decrease the different types of data that are currently compiled to perform the various tests for determining lithographic image quality.

It is a further object of the present invention to increase the number of different tests that can feasibly be performed to determine lithographic image quality in a realistic manufacturing setting.

The present invention provides, in a first aspect, a method for determining print bias for a design image in a lithographic system. The method comprises imaging a print bias target in a single layer of light-sensitive material, the print bias target including a plurality of isolated edges. After imaging the print bias target, the positioning of at least one of the plurality of isolated edges relative to a corresponding isolated edge in the design image is determined, thereby determining the print bias. The method may further comprise a step of adjusting the lithographic system to decrease the print bias based on the determine print bias. The print bias target may include a plurality of target regions, each target region having an image structure different from that of each of the other target regions immediately adjacent thereto, the plurality of target regions forming the plurality of isolated edges. Where the print bias target includes the plurality of target regions, the step of imaging may comprise imaging at least one of the plurality of target regions by phase shifting. In addition, the step of imaging may comprise imaging a print bias target including a plurality of concentric geometric shapes of a single type.

In a second aspect of the present invention, a method for determining at least one of a focus setting and exposure setting for minimizing print bias in a lithographic system is provided. The method comprises imaging a print bias target matrix from a design image in a single layer of light-sensitive material, the print bias target matrix including a plurality of print bias targets of varying exposure and focus, each print bias target including a plurality of isolated edges. After imaging the print bias target matrix, print bias for one of the plurality of isolated edges in each of the print bias targets is determined. A mathematical model for imaging with the lithographic system is also derived. Once the mathematical model is derived and the print bias is determined, the determined print bias is correlated to the mathematical model and at least one of the focus setting and exposure setting is determined, based on the correlated determined print bias.

In a third aspect of the present invention, a method for identifying an imaging aberration in an image created in a lithographic system is provided. The method comprises imaging a print bias target matrix from a design image in a single layer of light-sensitive material, the print bias target matrix including a plurality of print bias targets of varying exposure and focus, each of the plurality of print bias targets including a plurality of isolated edges in a first orientation and a plurality of isolated edges in a second orientation. After imaging the print bias target, print bias is determined for one of the plurality of isolated edges in the first orientation and one of the plurality of isolated edges in the second orientation for the print bias target matrix. A print bias/focus plot is then created of the determined print bias against focus setting for the one isolated edge in the first orientation and the one isolated edge in the second orientation. Based on the print bias/focus plot, the imaging aberration is then identified.

In a fourth aspect of the present invention, a method for determining a slope of an imaging profile of an image created in a lithographic system is provided. The method comprises imaging a print bias target in a single layer of light-sensitive material, the print bias target including a plurality of isolated edges. After the print bias target is imaged, print bias is determined a predetermined number of times for one of the plurality of isolated edges at each focus setting in a range of focus settings, and an average print bias for the one isolated edge is calculated. A standard deviation for the determined print bias at each focus setting is determined, and a plot is created of average print bias against the range of focus settings for the one isolated edge. A line is then best-fit to average print bias points in the plot corresponding to a portion of the range of focus settings having less than a maximum predetermined standard deviation. After best fitting the line, a slope therefor is determined.

In a fifth aspect of the present invention, a method for determining overlay in a lithographic system is provided. The method comprises imaging a print bias target in a single layer of light-sensitive material covering a prior-level image, the print bias target including a plurality of isolated edges. A center of the prior-level image is determined, along with an average center for the print bias target. After the center and average center are determined, a location of the average center relative to the center is determined, thereby determining the overlay. The print bias target may comprise a pair of concentric geometric shapes. The average center thereof being determined by finding a midpoint between corresponding sides of the concentric geometric shapes, treating the collection of midpoints on all sides of the concentric geometric shapes as an intermediate shape, the center of which is the average center for the print bias target.

In a sixth aspect of the present invention, a mask is provided comprising a design image for imaging a print bias target in a single layer of light-sensitive material for determining print bias in a lithographic system. The design image comprises a plurality of target regions, each target region having an image structure different from that of each other of the plurality of target regions immediately adjacent thereto, the plurality of target regions forming a plurality of isolated edges in the print bias target.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
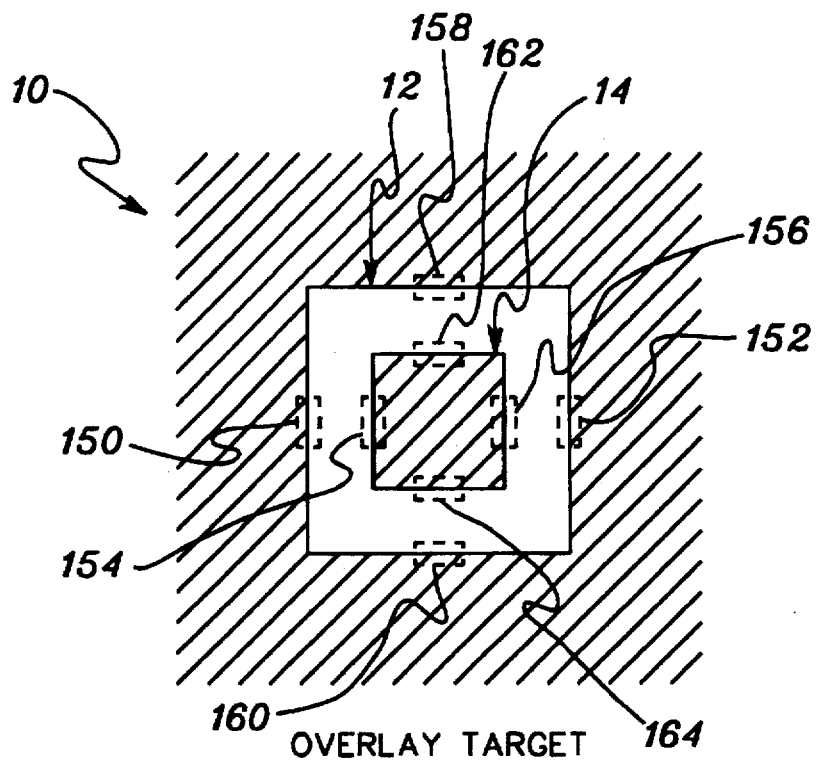
FIG. 1 depicts a prior art overlay target.

FIG. 1 is a plan view of a two-level prior art overlay target 10. Target 10 comprises a large box 12 created at a first lower level, and a smaller inner box 14 created at a second upper level. As shown in FIG. 1, the portion of box 12 not covered by box 14 is clear, indicating that the light-sensitive material has been removed. The diagonal lines inside box 14 indicate light-sensitive material that has not been removed. Assume that overlay target 10 has been created using a positive resist. Overlay is defined as the quality of registration (or alignment) of one lithographic level to another, indicating how well the mask or reticle design is being replicated. A reticle is simply a mask where, due to manipulation of the lithographic system, a relationship other than a 1:1 relationship between the mask size and image size is created, i.e., the design has been reduced or enlarged.

The overlay target 10 of FIG. 1 is referred to as a box-within-a-box type. In the simplest terms, an overlay measurement system determines how well inner box 14 is centered within outer box 12 in the coordinate plane the overlay target is imaged in. This determination is made by detecting isolated edges, which are edges separating two different image structure regions on the target and which are not affected by other edges that may be too close, causing interaction therebetween.

An example of an overlay measurement with respect to overlay target 10 in FIG. 1 will now be given. Each of the dashed boxes around an edge, for example, dashed box 150, represents an area or detection window where the overlay measurement tool will search for an isolated edge with reference to a reference point. The measurement system views overlay target 10 as existing in an X,Y coordinate plane. The measurement system first detects all of the isolated edges associated with both outer box 12 and inner box 14. The measurement tool then calculates a coordinate pair representing the overlay determination for overlay target 10. The X coordinate center of outer box 12 is first found by finding the average between the isolated edges within detection windows 150 and 152. Similarly, the X coordinate center of inner box 14 is found by determining the average of the isolated edges found within detection windows 154 and 156. The overlay X coordinate in then found by subtracting the average for the X coordinate inner box from the average for the X coordinate of the outer box. The overlay Y coordinate value is determined in a similar fashion using the edges found by the measurement tool in detection windows 158, 160, 162 and 164. The focus of the overlay measurement is a comparison of the center of the lower level image with the center of the upper level image.

Figure 2:
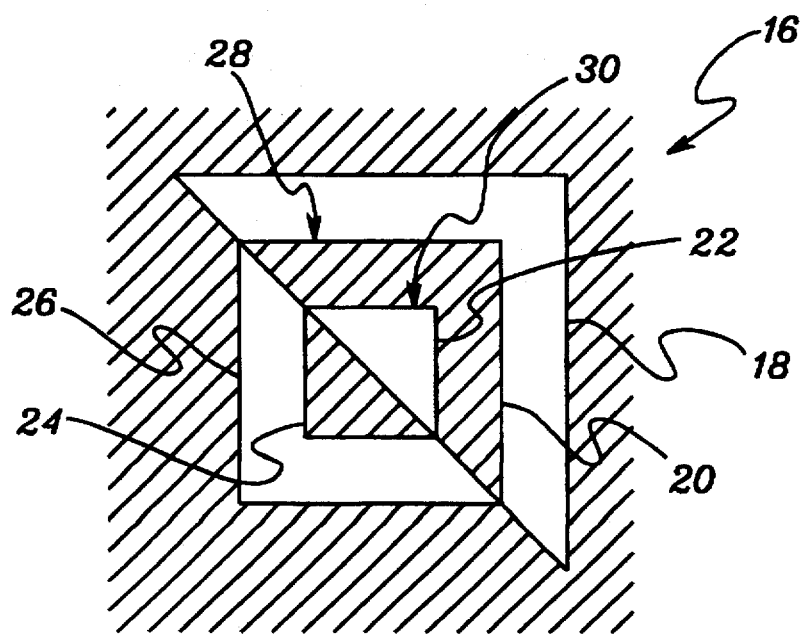
FIG. 2 depicts a print bias target according to the present invention.

FIG. 2 depicts a plan view of one embodiment of a print bias target 16 according to the present invention. Preferably, the print bias target of the present invention is at least five times the resolution limit of the lithographic system used to create the print bias target. In general, print bias target 16 comprises alternating regions of two image structure types (i.e., polarity), referred to as a "binary" target. This means that the mask or reticle image (hereinafter, referred to generally as a "mask") producing target 16 was, in optical terms, clear in some areas and opaque in other areas. Assuming a positive resist as the light-sensitive material, regions of target 16 that are clear correspond to regions of the mask that were clear and in which light shown through. As one skilled in the art will appreciate, the regions of the resist in which target 16 was imaged that were exposed to light were developed away, for example, by etching or the use of a solvent. The image design of print bias target 16 is of concentric geometric shapes, in this case, concentric squares.

Print bias target 16, broken down to its constituent target regions, comprises region 18 of a first polarity, in this case a negative polarity. Adjacent to region 18 is region 20, which is of a second polarity different than the first, in this case a positive polarity. Adjacent to region 20 is region 22, which comprises a polarity different from that of region 20 and in this case the same as that of region 18. Adjacent to region 22 is region 24, which is of a different polarity than region 22, and in this case comprises a polarity the same as region 20. Finally, adjacent to region 24 is region 26 which also comprises a different polarity than that of region 24, in this case being the same as regions 22 and 18. As one can appreciate from FIG. 2, regions 20 and 26 comprise an outer box 28, and regions 22 and 24 comprise an inner box 30 lying inside box 28. Region 18 is present so that there is a region adjacent region 20 of a polarity different therefrom. Print bias target 16 is created on a single lithographic level, unlike overlay target 10 of FIG. 1. Although print bias target 16 has been described in terms of concentric squares of alternative image structure, it will be understood that a print bias target of the present invention is one in which at least one isolated edge is easily detectable and is imaged in a single lithographic level or layer.

Figure 3:
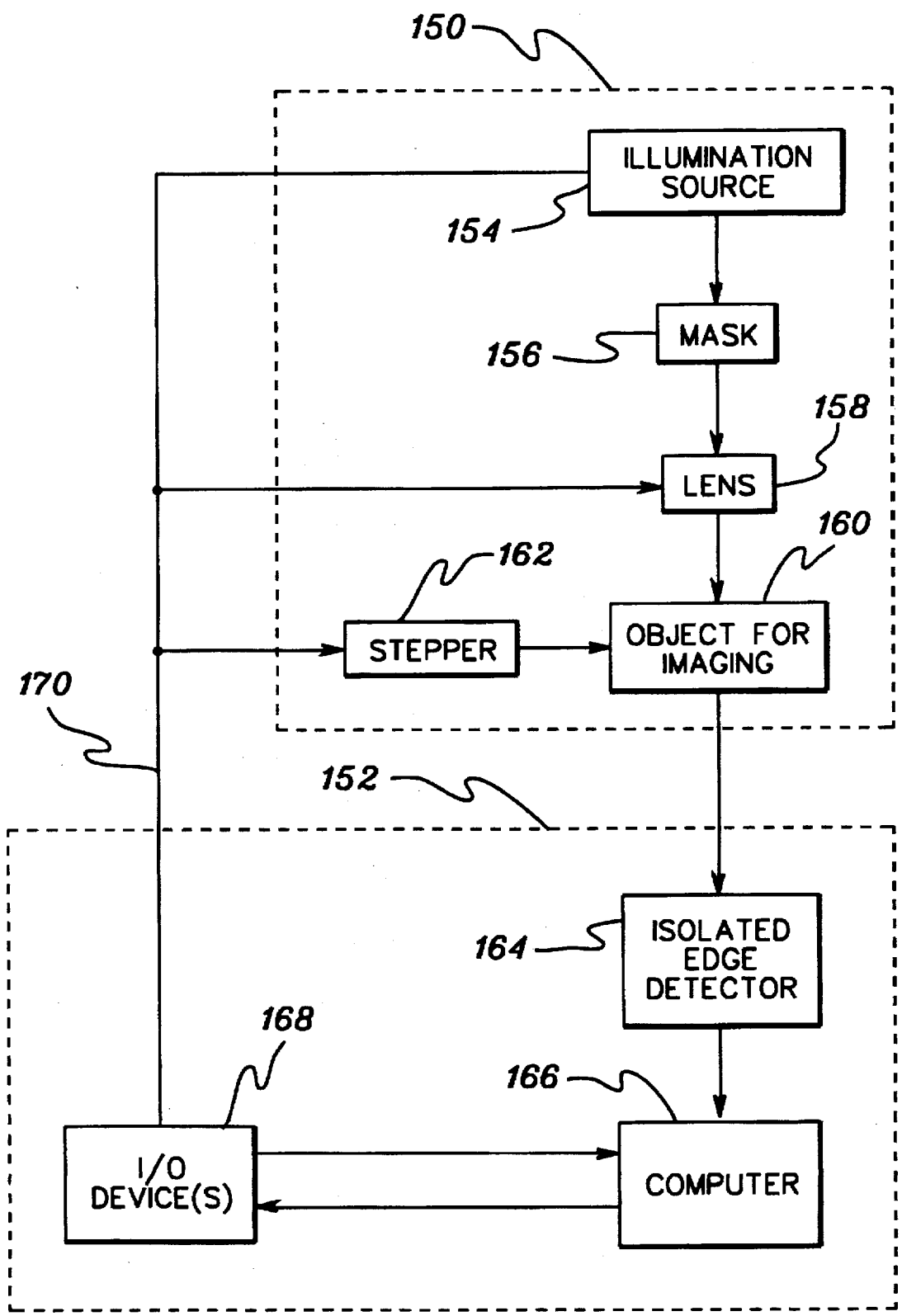
FIG. 3 is a block diagram of an exemplary imaging system useful in performing the various methods of the present invention.

FIG. 3 is a block diagram of an exemplary imaging system, in this case projection imaging system 150, and print bias measuring tool 152 useful in performing the various methods of the present invention with respect to, for example, semiconductor wafers. Projection imaging system 150 comprises an illumination source 154, mask 156, lens 158, an object for imaging 160 and an accurate X, Y, Z location controller or stepper 162. Illumination source 154 may comprise, for example, a mirror, a lamp, a light filter and a condenser lens system. Illumination source 154 outputs "light" to mask 156, having a pattern thereon for replication. For example, mask 156 may include a pattern for projecting a wiring level of an integrated circuit under fabrication. The pattern of mask 156 may include various image structures, for example, clear areas, opaque areas or even phase shifting areas.

As one skilled in the art will know, a physical "binary" mask is one where the mask is clear in some areas and opaque in other areas. The combination of clear areas and opaque areas in conjunction with incident light, image the mask design in the light-sensitive material. A mask may also include a phase shifting region. Phase shifting is where there is included, in or on the mask (i.e., in a different plane than the rest of the mask), a means for altering the phase of light passing therethrough. This creates a phase difference that is useful for imaging smaller features. A further discussion of phase shifting can be found in U.S. Pat. No. 5,300,786 issued to Brunner et al. and assigned to IBM, which is herein incorporated by reference in its entirety.

As used herein, the term "light" refers to light used in photolithography. The terms "light" and "photolithography" in the specification need not be restricted to visible light, but may also embrace other forms of radiation and lithography. For example, energy supplied by lasers, photons, ion beams, electron beams or x-rays are all included within the term "light". Accordingly, the term "mask" is meant to include not only a physical structure, but also a digitized image used in, for example, electron beam and ion beam lithography systems. Light passing through mask 156 intersects a lens 158, which may be, for example, a reduction lens for focusing the mask pattern onto the object for imaging 160, in this case a semiconductor wafer. The object for imaging 160 is held in position by, for example, a vacuum hold device which is part of and controlled by an accurate X, Y, Z location controller or stepper 162.

One generalized embodiment of a print bias measuring tool 152 pursuant to the present invention is depicted in FIG. 3. Print bias measuring tool 152 is coupled to projection imaging system 150. It will be understood that print bias measuring tool 152 may be automated or may be operated by a human operator. The main purpose of print bias measuring tool 152 is to detect an isolated edge within a print bias target imaged in the object for imaging 160, and determine a print bias therefor with respect to the design image of mask 156, which computer 166 holds in memory. Print bias measuring tool 152 comprises isolated edge detector 164, computer 166 and input/output device(s) 168. Isolated edge detector 164 detects, directly or indirectly, isolated edges and computer 166 compares the positioning of the isolated edges detected to that of the design image of mask 156 stored in memory (not shown). Such information can be displayed or stored through appropriate I/O devices 168 for operator information which may be acted on thereby, or employed as an automated feedback control signal (via line 170) to automatedly control projection imaging system 150 to improve the imaging of the object 160. For example, for the basic print bias method of the present invention, illumination source 154 may be altered based on the results. As another example, the focus setting of lens 158 may be altered where performance of the method of determining aberrations of the present invention identifies an aberration. As still a further example, lens 158 focus and/or object positioning via stepper 162 may be altered based on the results of performing the overlay method of the present invention. Computer 166 may comprise, for example, local memory, a central processing unit and an arithmetic and logic unit. I/O device(s) 168 may comprise, for example, a monitor, a mouse, a keyboard and appropriate storage and retrieval systems. Whatever print bias measurement system is used, it is important that it have the ability to establish a consistent focus; that is, the focusing subsystem should be of good quality. It will be understood that various measurement systems are capable of accomplishing the task of print bias measuring tool 152, such as, for example, a scanning electron microscope, a scanning confocal microscope, various optical measurement systems (using the wavelength of light instead of electrons to measure) or the alignment system of a photolithography tool.

Figure 4:
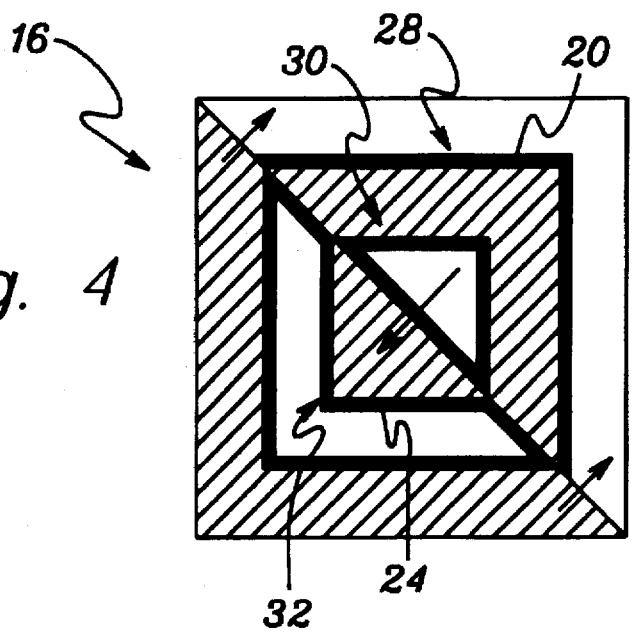
FIG. 4 depicts the print bias target of FIG. 2 under conditions of underexposure.

FIG. 4 depicts print bias target 16 of FIG. 2 under conditions of underexposure by the lithography system. As one skilled in the art will know, underexposure of a positive resist causes larger features to be imaged than called for by the mask. Underexposure can be seen in target 16 by inner box 30 being off-center with respect to outer box 28; more specifically, inner box 30 appearing to have moved toward the lower left hand corner of outer box 28. Due to underexposure, regions 20 and 24 of target 16 are larger than intended in the design image (see FIG. 5). In an actual measurement system, underexposure of target 16 is indicated by detecting isolated edge 32 and determining that it is not in the correct position according to the design image. In the case of FIG. 4, a negative print bias value is preferably returned.

Figure 5:
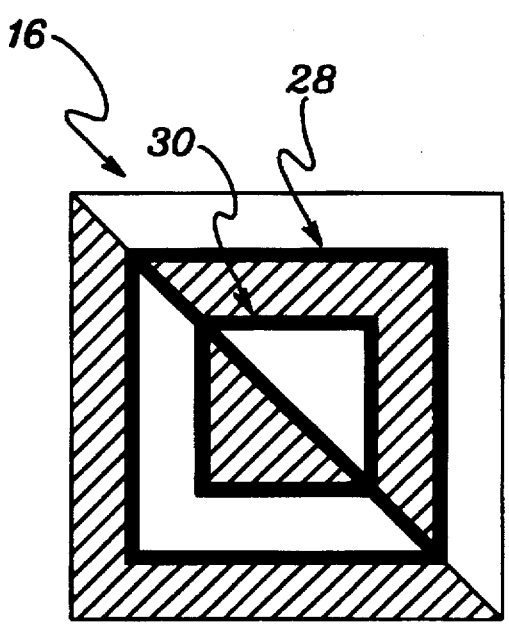
FIG. 5 depicts the print bias target of FIG. 2 under conditions of best exposure.

FIG. 5 depicts print bias target 16 at what will be termed herein as "best exposure", meaning that inner box 30 is centered within outer box 28. For the best exposure situation, a print bias value of zero (0) for each edge type (here, horizontal and vertical edges) would preferably be returned, and is the most faithful replication of the print bias target.

Figure 6:
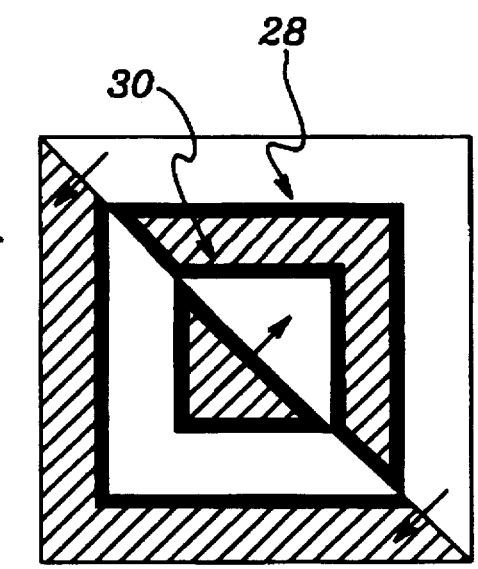
FIG. 6 depicts the print bias target of FIG. 2 under conditions of overexposure.

FIG. 6 depicts a situation where print bias target 16 has been overexposed by the lithography system. Overexposure is characterized by inner box 30 being off center within outer box 28, and more specifically, inner box 30 appearing closer to the top right corner of outer box 28 as compared to the best exposure situation of FIG. 5.

Figure 7:
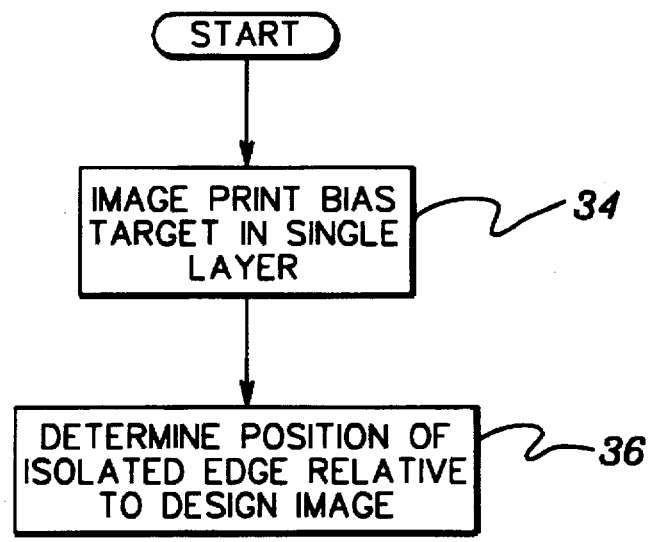
FIG. 7 is a flow diagram of a method for determining print bias according to the present invention.

FIG. 7 is a flow diagram of a method for determining print bias with respect to a design image in a lithographic system. The method of FIG. 7 begins by imaging a print bias target in a single layer of a light sensitive material (STEP 34, "IMAGE PRINT BIAS TARGET IN SINGLE LAYER"). As with print bias target 16, the exemplary print bias target of the present method includes a plurality of target regions (for example, region 20 in print bias target 16), each target region having an image structure different from that of all other target regions immediately adjacent thereto. The interspersing of different image structure target regions within print bias target 16 improves the detection of isolated edges used to determine print bias by providing isolated edges bordering different regions. After the print bias target has been imaged, a position of an isolated edge in the imaged print bias target relative to a corresponding isolated edge in the design image of the mask is determined (STEP 36, "DETERMINE POSITION OF ISOLATED EDGE RELATIVE TO DESIGN IMAGE").

The step of imaging a print bias target according to the present invention (STEP 34) includes providing a mask having a print bias target design. The imaging step also includes providing a substrate with a light-sensitive material coated thereon, in which a print bias target may be imaged. This imaging is accomplished by shining light through the mask or selectively shining light according to the image design to expose selected portions of the light-sensitive material to light. For example, assuming a positive resist and an optical imaging system, regions 18, 22 and 26 in print bias target 16 of FIG. 2 were all exposed to light that has passed through a physical mask having the print bias target design thereon. After exposure, selected portions of the light-sensitive material are removed. In the context of print bias target 16, regions 18, 22 and 26 indicate places where the positive resist was exposed to light and subsequently removed, for example, by using a solvent or by etching.

The step of determining a position of an isolated edge relative to the design image comprises the measurement device searching the imaged print bias target for a given isolated edge, for example, isolated edge 32 in FIG. 4. The measurement device compares the detected isolated edge with a corresponding edge in the design image of the mask to determine whether the isolated edge is placed properly, and if not, to what extent it is misplaced. With respect to exemplary print bias measurement tool 152, the comparison is accomplished through computer 166 programmed appropriately. In the context of the present embodiment, a print bias value will be returned by the measurement device indicative of underexposure, overexposure or proper exposure. For example, in the present embodiment, a negative print bias value indicates an underexposed condition, a positive print bias value indicates an overexposed condition and a print bias value of zero in this simplified embodiment indicates the best exposure condition. However, it will be understood that best exposure may be other than zero in practice, for example, if overexposure to obtain smaller line width is necessary.

After determining print bias, the information can be used to adjust the lithographic system in an attempt to remove or decrease the degree of print bias. Where the print bias information is fed back to the lithography system for improving same, the print bias targets would be, in the case of semiconductor chips, included on a product wafer, for example, in the kerf section thereof. However, the print bias target could also be used on sacrificial wafers to "calibrate" the lithographic system prior to processing of product wafers.

Figure 8:
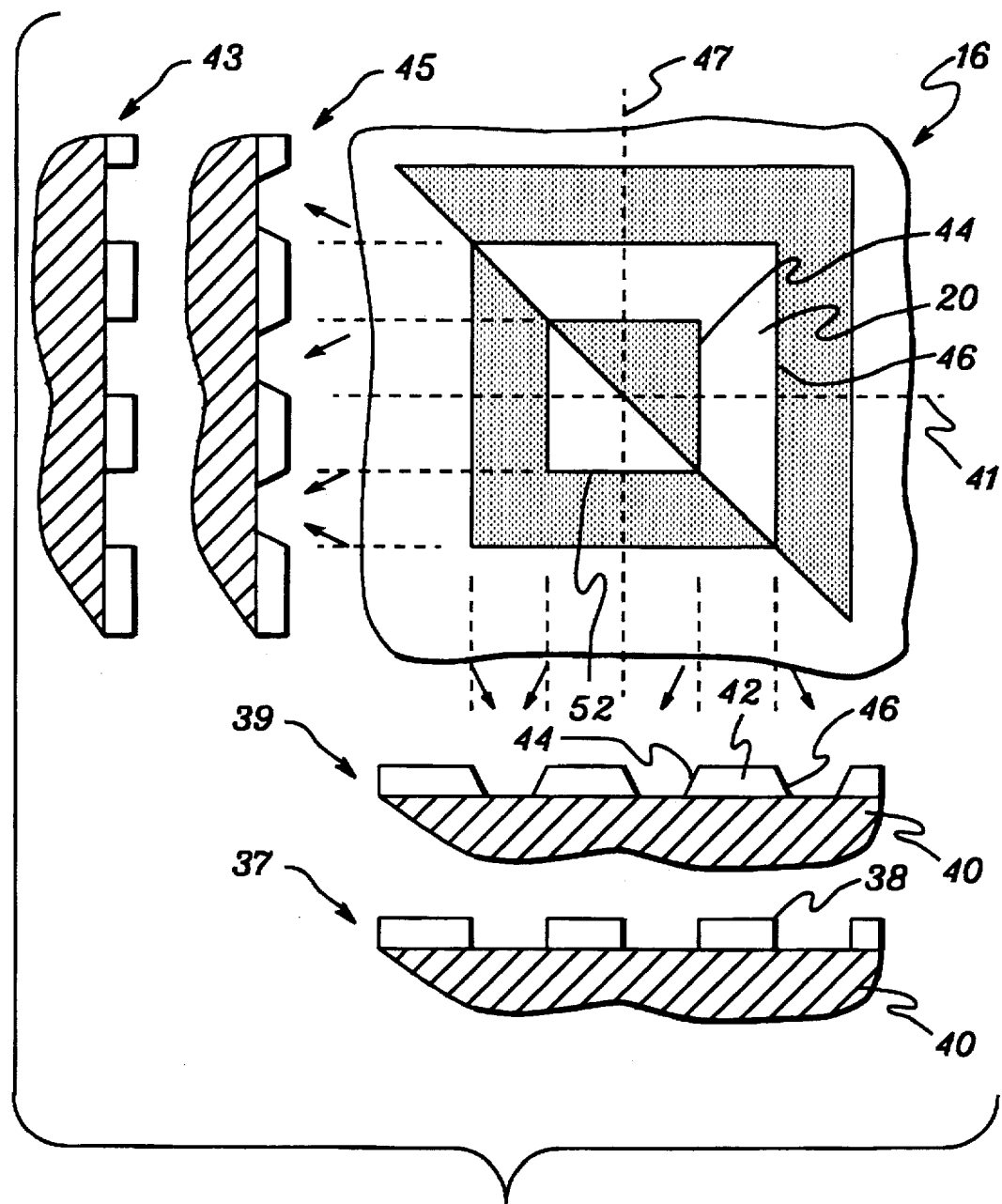
FIG. 8 depicts the print bias target of FIG. 2 with actual and ideal profiles thereof.

FIG. 8 depicts print bias target 16 along with actual and ideal profiles thereof. Ideal profile 37 and actual profile 39 are taken along line 41. Similarly, ideal profile 43 and actual profile 45 are taken along line 47. FIG. 8 shows that each isolated edge, in practice, will have some type of a slope associated therewith. Ideally, resist portion 38 corresponding to section 20 in print bias target 16 creates a 90° angle on either side thereof with respect to substrate 40. However, in practice a profile of print bias target 16 shows that section 20, corresponding to profile section 42, has a slope associated with each of the isolated edges 44 and 46 thereof. The slope information is useful for biasing the next process step, for example, etching trenches in silicon. As another example, the slope information may help determine whether an unusually high print bias was due to de-focus or exposure.

Figure 9:
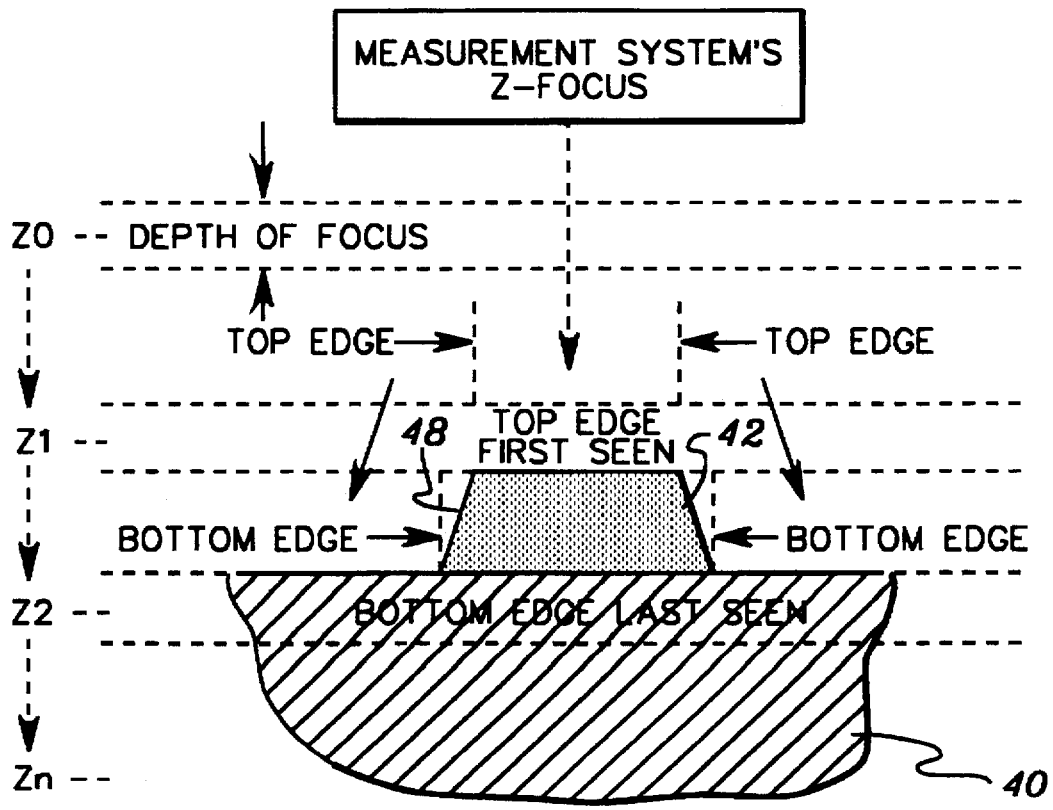
FIG. 9 depicts an enlarged version of a portion of the actual profile of the print bias target in FIG. 8.

FIG. 9 depicts an enlarged version of profile section 42 from FIG. 8. FIG. 9 also illustrates, in conjunction with FIG. 10 (discussed subsequently), the effect of the measurement systems' depth of focus on print bias determination. As shown in FIG. 9, the top edge of profile section 42 is first seen at Z focus position Z1. As the Z focus of the measurement system is changed from Z1 to Z2, the measurement system will interpret different portions of slope 48 to be the isolated edge. This will, of course, produce different print bias information depending on the Z focus of the measuring system.

Figure 10:
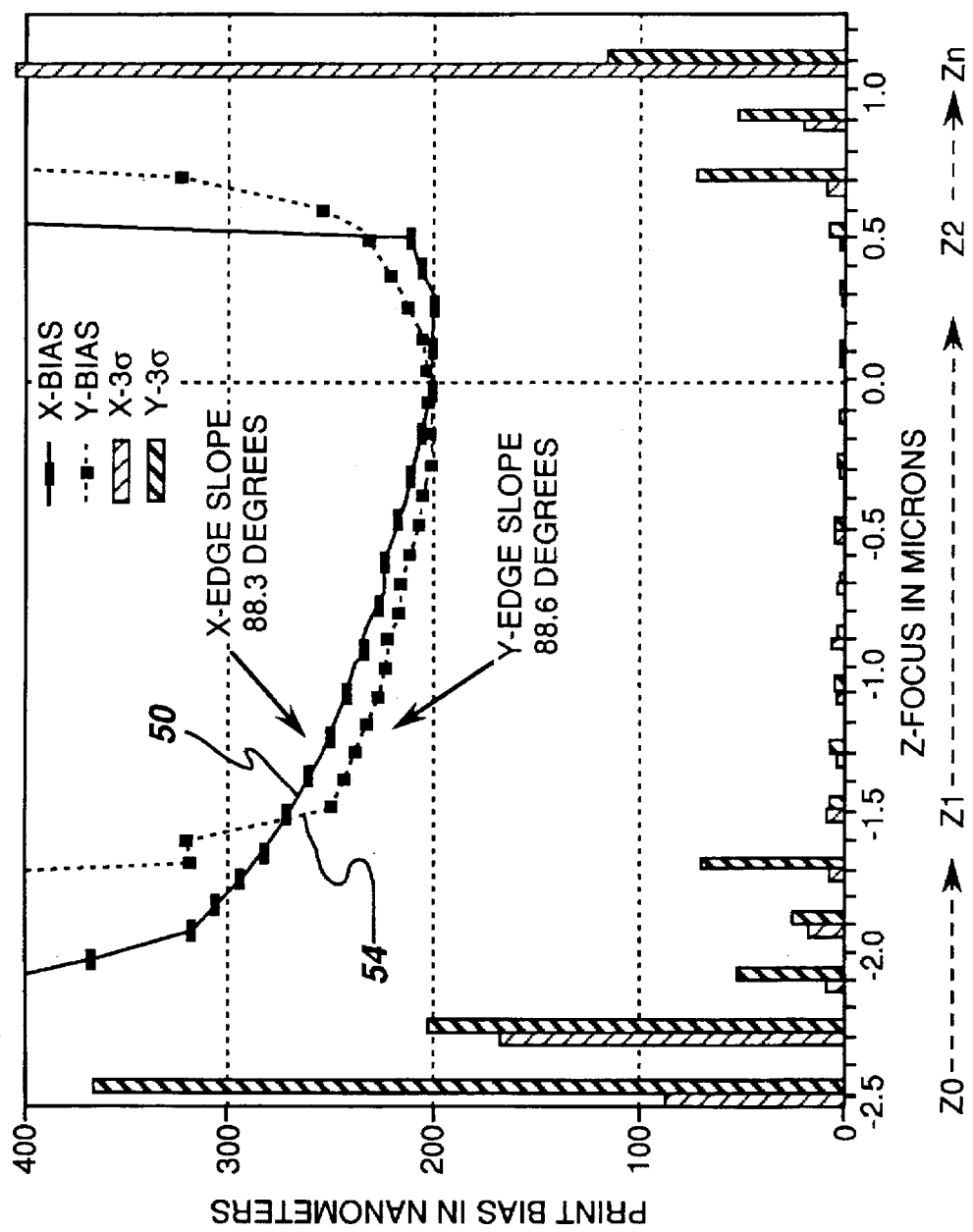
FIG. 10 is a plot of average print bias for isolated edges of two different orientations vs. Z focus of the print bias measuring device.

FIG. 10 plots, along line 50, average print bias versus Z focus for X edge slope 52 in FIG. 8, and along line 54 plots average print bias versus Z focus for Y edge slope 48 in FIG. 9. Each data point along each of lines 50 and 54 is an average of three print bias values for the same isolated edge at a given Z focus setting. Preferably, at least three print bias determinations are made at each focus setting in order to get a sense of the repeatability of the measurement at that setting. In addition, FIG. 10 plots variations in print bias determinations at a given Z focus for both X edge slope 52 and Y edge slope 48. More specifically, each bar graph portion of FIG. 10 is three times the standard deviation of the print bias values associated with the corresponding focus setting. As can be seen from FIG. 10, print bias information obtained at the periphery of the Z focus settings for the measurement system is inherently unreliable. However, from about −1.5 on the Z focus scale to about 0.0 on the Z focus scale, lines 50 and 54 approach linearity to the point where a best-fit line can be determined, as well as an associated slope therefor.

Before the slope of an isolated edge profile is determined, several other parameters will be examined. The measurement system's total depth-of-focus is calculated by:

depth-of-focus=w/na, where w=measurement system nominal wavelength of light used during measurement, and na=numerical aperture of the measurement system lens.

In the present embodiment, assume a nominal wavelength of 0.5 microns and a numerical aperture of 0.5. As indicated previously, not all the print bias measurements taken along the edge profile are reliable (see the X and Y-three sigma bars in FIG. 10). However, one can expect a range of Z focus settings where a best-fit line can be drawn through the corresponding print bias values. A range of expected low three-sigma measurements can be determined by adding the thickness of the layer of light-sensitive material used together with the measurement system's depth of focus. Assume, in the present embodiment, a range of 2 microns, i.e., a thickness of 1 micron and a depth of focus of 1 micron. To find the slope of the isolated edge profile, a best fit line is drawn for the print bias data points over the range of low three-sigma measurements. The best-fit line may be drawn by conventional methods, such as regression analysis. The result of the best-fit line equation, in the form of y=mx+b provides an X coefficient (i.e., m), which, if divided by two, provides the average edge slope of a single edge. The angle for the best-fit line in degrees is found by:

slope=arc cos ((m*−0.001/2)=88.3 degrees.

Note that in the present exemplary embodiment, the X coefficient of the best-fit line is −0.060 nm/microns. Also note that the value −0.001 converts nanometers to microns and provides a positive slope value in degrees.

Finding the profile slope in accordance with the present invention prevents having to use destructive methods currently used to obtain the same information. For example, one way to examine the profile is by breaking the substrate and using a scanning electron microscope to get a picture of the profile; then, using a ruler and protractor, the slope may be determined from the picture. However, this common method is not very accurate and, as indicated previously, is destructive to the substrate involved. Finding the profile slope according to the present invention is non-destructive and can be done with an accuracy of up to ±0.1°.

Figure 11:
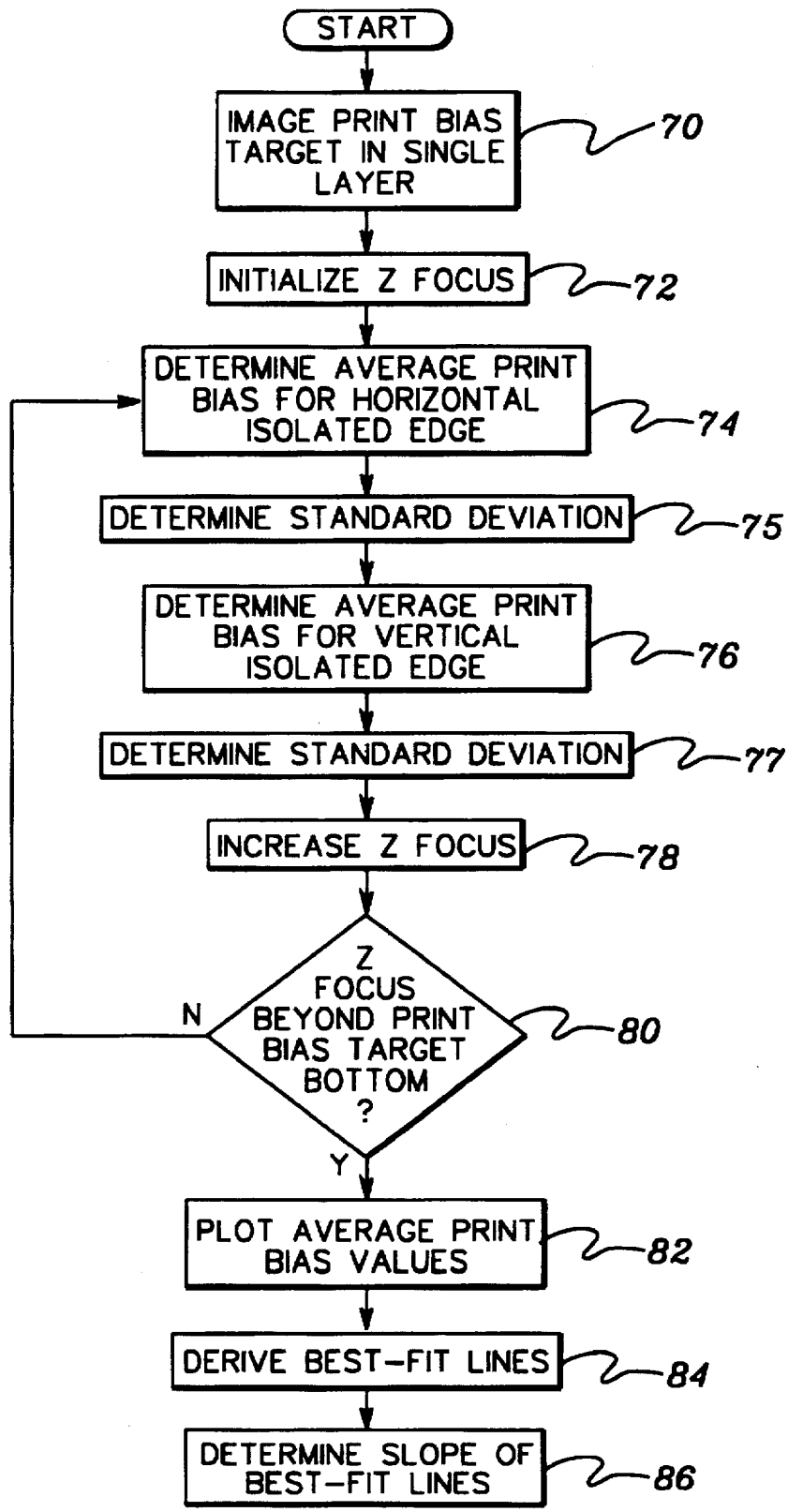
FIG. 11 is a flow diagram of a method for determining a slope of an imaging profile according to the present invention.

FIG. 11 is a flow diagram of a method for determining a slope of an imaging profile for an image created in a lithographic system according to the present invention. The method begins by imaging a print bias target in a single layer of light-sensitive material (STEP 70, "IMAGE PRINT BIAS TARGET IN SINGLE LAYER"). After imaging the print bias target, the measurement system Z focus is initialized, for example, to a low setting (STEP 72, "INITIALIZE Z FOCUS"). The print bias for a horizontal isolated edge is then determined a number of times, for example, three, and an average print bias is obtained (STEP 74, "DETERMINE AVERAGE PRINT BIAS FOR HORIZONTAL ISOLATED EDGE"). The standard deviation of the horizontal isolated edge print bias values is then found (STEP 75, "DETERMINE STANDARD DEVIATION"). The print bias for a vertical isolated edge is also determined a number of times and an average found (STEP 76, "DETERMINE AVERAGE PRINT BIAS FOR VERTICAL ISOLATED EDGE"). The standard deviation of the vertical isolated edge print bias values is then found (STEP 77, "DETERMINE STANDARD DEVIATION"). After determining average print bias for both the horizontal and vertical isolated edges, the system Z focus is increased (STEP 78, "INCREASE Z FOCUS"). After increasing the Z focus, an inquiry is made as to whether the Z focus is beyond the print bias target bottom (INQUIRY 80, "Z FOCUS BEYOND PRINT BIAS TARGET BOTTOM?"). If the system Z focus is not beyond the print bias target bottom, then the method returns to step 74. If the system Z focus is beyond the print bias target bottom, a plot is made of the average print bias values obtained (STEP 82, "PLOT AVERAGE PRINT BIAS VALUES"). After plotting the print bias values, best fit lines for the lowest standard deviation print bias values within a predetermined range of Z focus settings for each of the horizontal and vertical isolated edge print bias data are derived (STEP 84, "DERIVE BEST-FIT LINES"). The derivation may be, for example, a mathematical derivation, for example, using regression analysis, or it may be physically derived by "eye-bailing" the plotted print bias values. Finally, after deriving the best fit lines, the slope thereof is determined (STEP 86, "DETERMINE SLOPE OF BEST-FIT LINES").

The major factors affecting the quality of the print bias information returned by the measurement tool are exposure and focus, with exposure being affected by either the intensity of the incident light or the amount of time a particular area of light-sensitive material is exposed. A print bias target according to the present invention can be used in conjunction with a multivariant test to determine an appropriate focus and/or exposure for a lithographic system.

Figure 12:
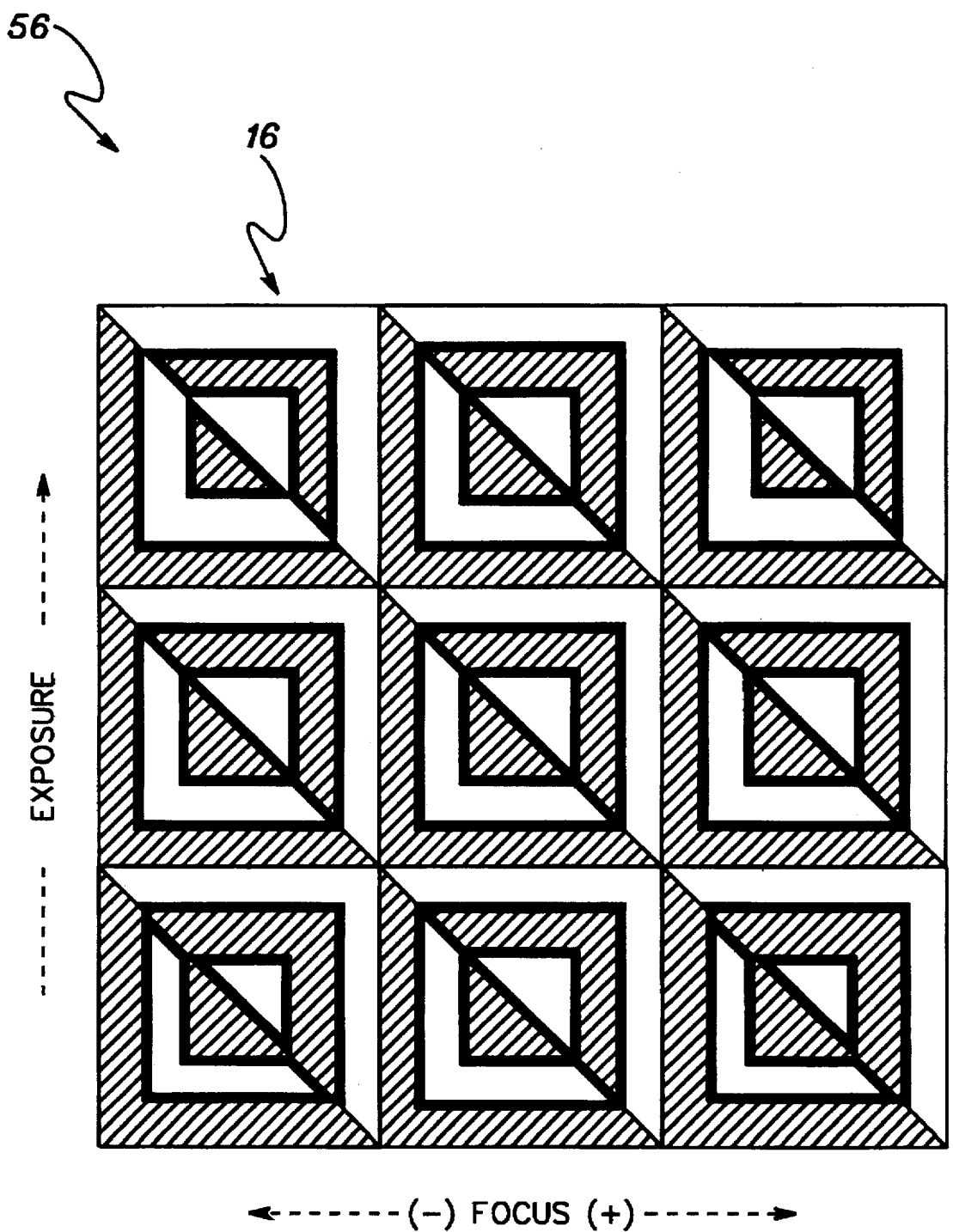
FIG. 12 depicts a matrix of print bias targets imaged at various exposure and focus settings.

FIG. 12 depicts a matrix 56 comprised of print bias target 16 imaged at various exposure and focus settings. Matrix 56 is created by imaging a print bias target mask design at a given exposure and focus setting, then microstepping to a location adjacent to the previously imaged print bias target with a slightly different exposure and/or focus setting and re-imaging the same target design. This procedure is followed until a matrix of a desired size is created, from which valuable information can be extracted. It will be understood that matrix 56 is shown as a simple matrix comprising nine print bias targets for ease of discussion only. In practice, such a matrix may include a considerably greater number of targets. It will also be understood that matrix 56 would not usually be imaged on a semiconductor product wafer in a lithographic system using a physical mask, since successive imaging of the print bias target may harm the product. However, such a matrix may be included on a product wafer where a non-physical mask is used, for example, E-beam or ion beam imaging systems.

Figure 13:
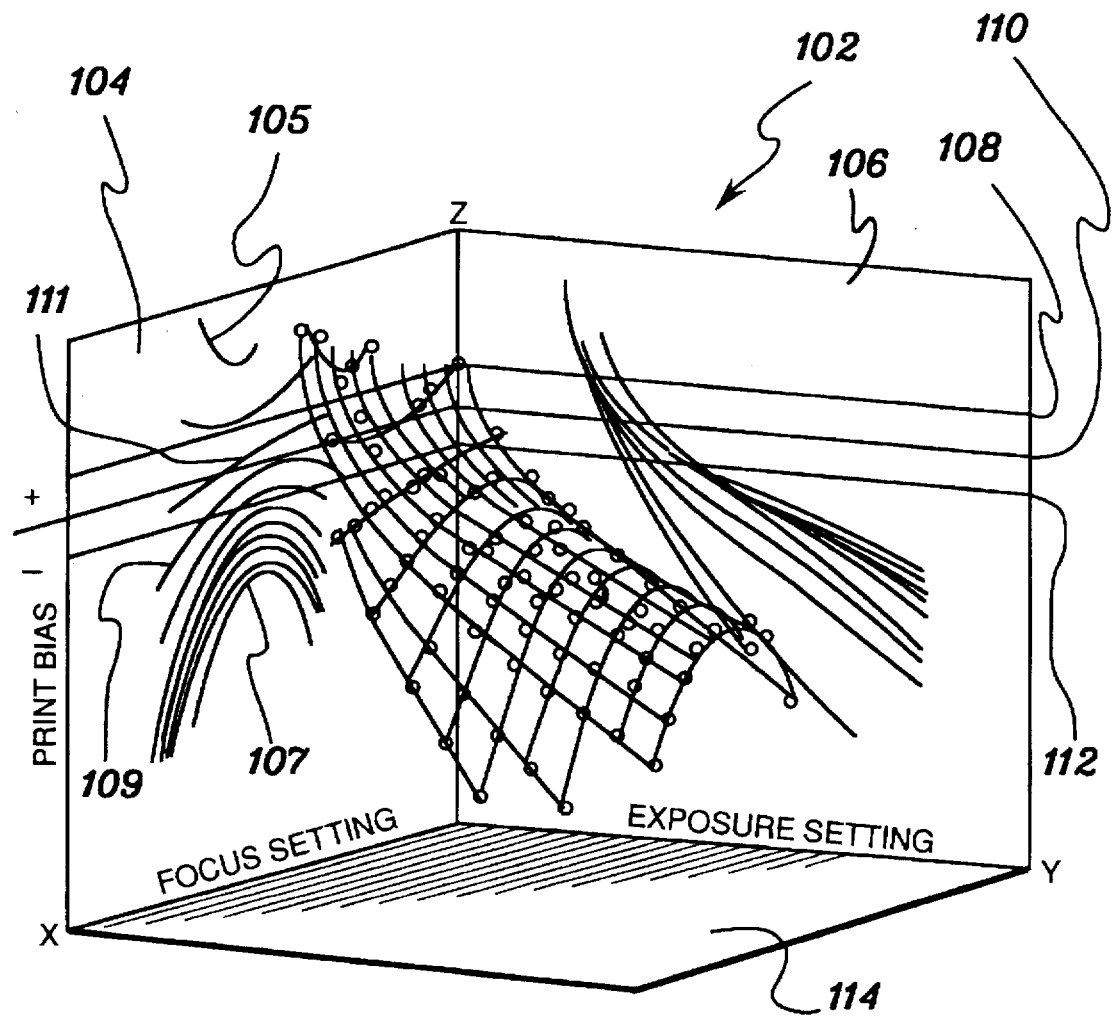
FIG. 13 is a three-dimensional plot of print bias vs. focus and exposure obtained from a print bias target matrix similar to that shown in FIG. 12.

FIG. 13 is a three-dimensional plot of print bias versus focus and exposure obtained from a print bias target matrix similar to that shown in FIG. 12, but of a larger size. Focus setting is plotted along the X axis of plot 102, exposure setting is plotted along the Y axis and print bias is plotted along the Z axis. A silhouette of the three-dimensional plot against the X,Z plane 104 provides information for determining best focus for the lithographic system used to image the print bias target matrix corresponding thereto. Similarly, a silhouette of the three-dimensional plot against the Y,Z plane 106 provides exposures curves for determining best exposure. One way to determine best exposure using the silhouette in the X,Z plane 104 will subsequently be described. Another way to determine best exposure using the silhouette in the Y,Z plane 106 can be found in an article by H. Ohtsuk, K. Abe and Y. Itoh, entitled "Quantitative Evaluation Method At Conjugate Point for Practical Resolution of Wafer Stepper", appearing in SPIE Vol. 1088 Optical/Laser Microlithography II (1989) at page 124–132, which is herein incorporated by reference in its entirety.

A preferred method for determining best focus for a lithographic system will now be described in detail with respect to FIG. 13. After imaging a print bias target matrix and creating a three-dimensional plot, such as that shown in FIG. 13, the determination of best focus centers on the curves created by a silhouette of the three-dimensional plot in the X,Z plane 104. Prior to determining best focus, the print bias data obtained from the print bias matrix is fitted to a mathematical model representing the three-dimensional plot of FIG. 13. For example, the lines shown connecting data points in the three-dimensional plot of FIG. 13 represent the model that has been derived to fit those data points. Note that the print bias scale in FIG. 13 starts at line 110, is positive above line 110 and negative below line 110. The focus curves achieved from a silhouette of the three-dimensional plot, appearing in plane 104 of FIG. 13, include curve 105 at a minimum exposure, curve 107 at a maximum exposure, curve 109 at an exposure between the two extremes and a curve referred to as an "isofocal point" 111. The isofocal point 111 is a focus curve approaching or achieving linearity. Note that the derivation of the mathematical model is based in part on the type of equipment used, the particular process involved and the type of light-sensitive material being used. In short, the mathematical model may be derived using conventional derivation techniques, and will vary from application to application. Also note that the best fitting of the print bias data to the mathematical model may be done using conventional methods, such as regression. It will be understood that although curves 105, 107 and 109 are identified herein for determining best focus, one could use more than three of the focus curves; the use of three curves represents the preferred minimum number of curves. A point on each of the identified curves 105, 107 and 109 is identified which is closest to a desired print bias value. For example, assume that line 110 represents a desired print bias value. Thus, a point on curves 107 and 109 representing a maximum for those curves would be identified, and a point on curve 105 representing the minimum thereof would also be identified. The identified points on curves 105, 107 and 109 are then best fit to a straight line. Where the best-fit line intersects the isofocal point 111 is the point that determines the best focus. Thus, a vertical line from the intersection point is drawn to the focus axis to determine best focus. One way to determine best exposure using the focus curves is to identify the isofocal point and determine which exposure setting caused same. Note that the present method of determining best focus,from a three-dimensional plot of print bias versus focus and exposure is most reliable when the lithographic system is operating at five times its resolution limit or higher, since at such resolution the behavior of print bias is similar to that of line width.

Figure 14:
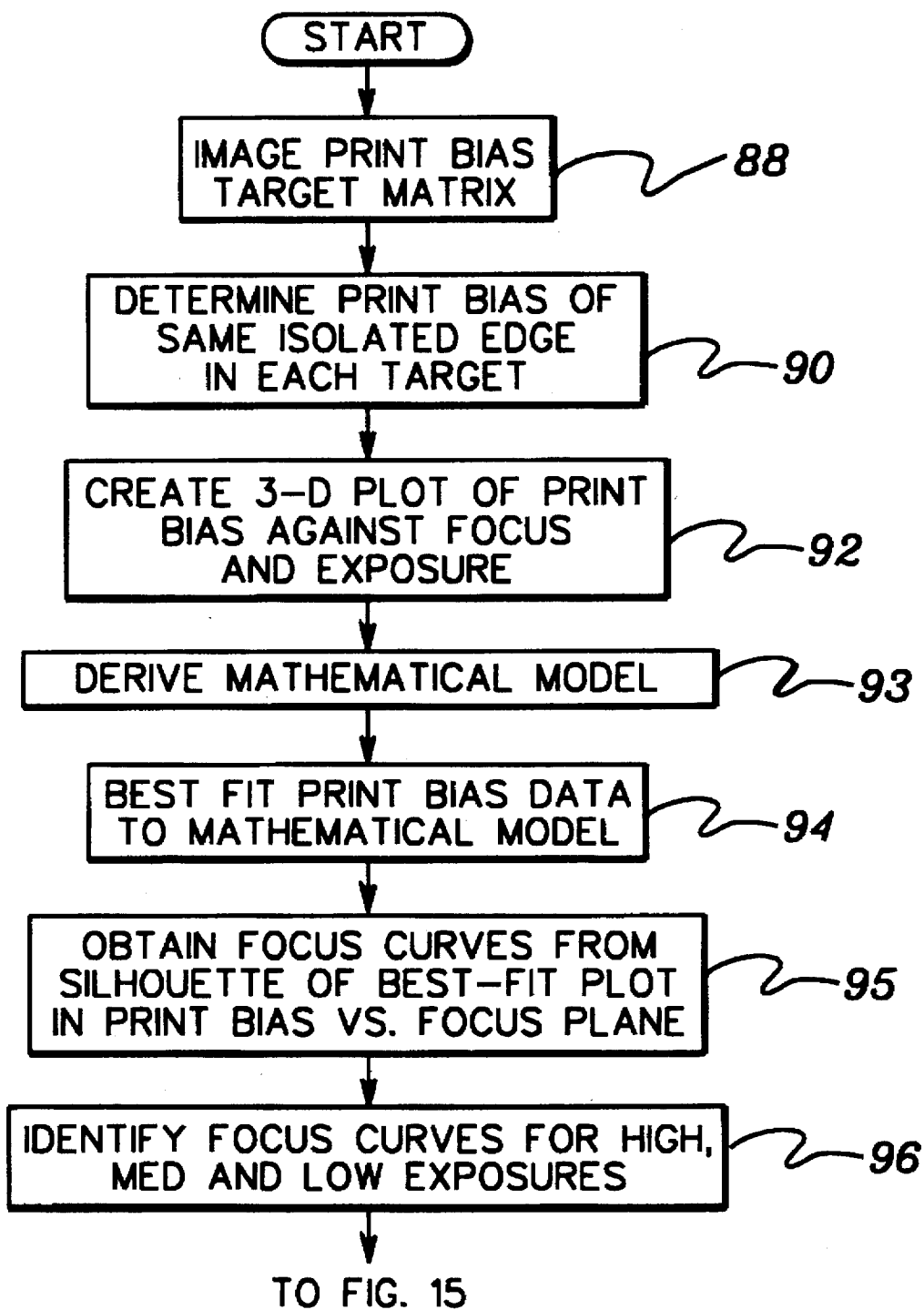
FIGS. 14 and 15 comprise a flow diagram of a method for determining best focus for a lithographic system according to the present invention.
Figure 15:
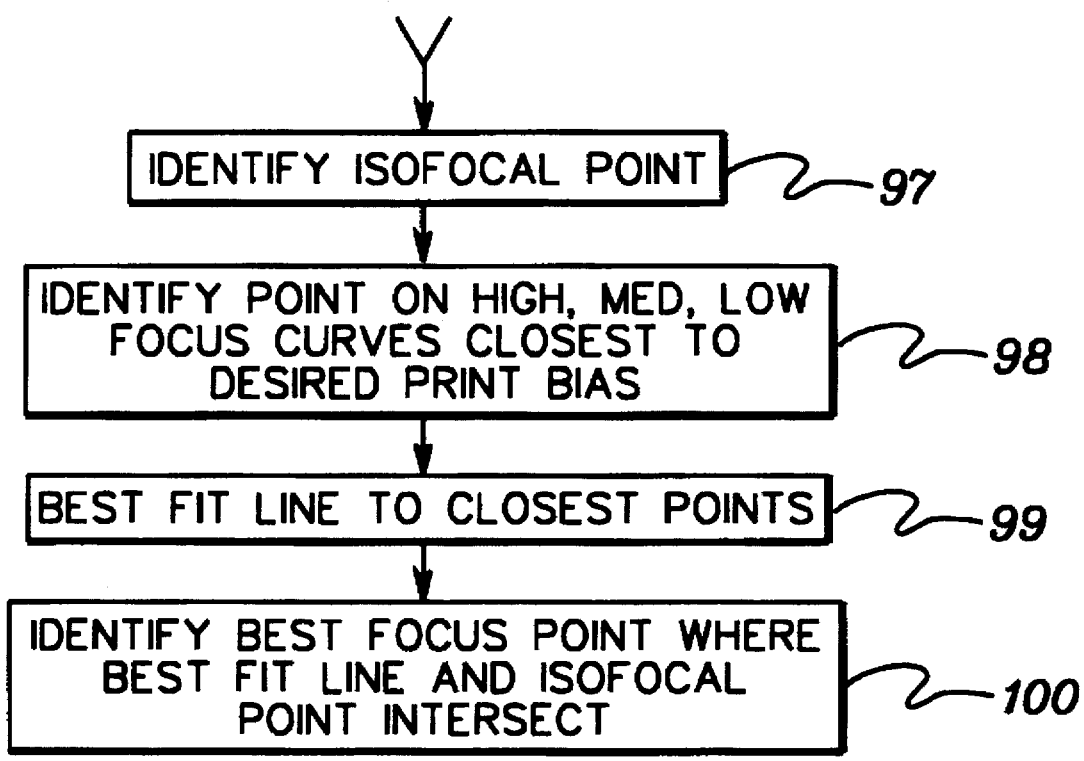

FIGS. 14 and 15 comprise a flow diagram of a method for determining best focus for a lithographic system according to the present invention. The method begins by imaging a print bias target matrix (STEP 88, "IMAGE PRINT BIAS TARGET MATRIX"). Step 88 may be performed by initializing the exposure and focus settings for the lithographic system, imaging a print bias target, determining whether the matrix is completed, and if not, microstepping to another location and altering the exposure and/or focus and imaging another print bias target. The process is repeated until the print bias target matrix is completed. After the print bias target matrix is imaged, the print bias of the same isolated edge in each target of the matrix is determined (STEP 90, "DETERMINE PRINT BIAS OF SAME ISOLATED EDGE IN EACH TARGET"). After determining print bias, a three-dimensional plot is created for print bias against focus and exposure (STEP 92, "CREATE 3-D PLOT OF PRINT BIAS AGAINST FOCUS AND EXPOSURE"). Based on the equipment used, the particular process, the type of light-sensitive material being used and various other factors, a mathematical model is derived for the relevant imaging process in terms of print bias, focus and exposure (STEP 93, "DERIVE MATHEMATICAL MODEL"). The print bias data is then best fit to the mathematical model, shown in FIG. 13 as the "net" connecting the data points (STEP 94, "BEST FIT PRINT BIAS DATA TO MATHEMATICAL MODEL"). After the print bias data is best fit to the mathematical model, the focus curves are obtained by creating a silhouette of the best fit plot in the print bias versus focus plane 104 (STEP 95, "OBTAIN FOCUS CURVES FROM SILHOUETTE OF BEST-FIT PLOT IN PRINT BIAS VS. FOCUS PLANE"). Focus curves for high, medium and low exposures are then identified (STEP 96, "IDENTIFY FOCUS CURVES FOR HIGH, MED AND LOW EXPOSURES"). In addition, the isofocal point is also identified (STEP 97, "IDENTIFY ISOFOCAL POINT"). A point on each of the high, medium and low focus curves that is closest to a desired print bias is then identified (STEP 98, "IDENTIFY POINT ON HIGH, MED, LOW FOCUS CURVES CLOSEST TO DESIRED PRINT BIAS"). The closest points on the high, medium and low focus curves are then best fit to a straight line (STEP 99, "BEST FIT LINE TO CLOSEST POINTS"). The point where the best fit line and the isofocal point intersect is then used to determine best focus by identifying where a vertical line from the intersection point intersects the focus axis (STEP 100, "IDENTIFY BEST FOCUS POINT WHERE BEST FIT LINE AND ISOFOCAL POINT INTERSECT"). It will be understood that the steps of the flow diagram of FIGS. 14 and 15 beyond Step 90 may be determined by an appropriately programmed computer associated with the print bias measuring device. Thus, an operator of such a print bias measuring device may not actually see the three-dimensional plot, the silhouette or the best fit line.

Figure 16:
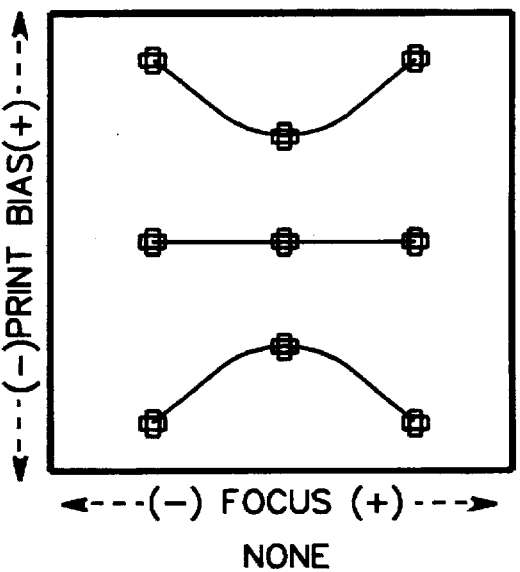
FIG. 16 is a plot of print bias vs. focus setting at several different exposures for both a horizontal and a vertical isolated edge showing no aberrations.

Print bias information obtained from a print bias target matrix according to the present invention is useful not only for determining best exposure and/or best focus, but also to identify aberrations in the print bias target caused by the lithographic system and/or the environment. FIG. 16 is a plot of print bias versus focus setting at several different exposures for both a horizontal and a vertical isolated edge according to matrix 56 in FIG. 12. FIG. 16 depicts the case where no aberrations are present in the print bias target, shown by the curves being coincident for both the horizontal and vertical isolated edge of interest.

Figure 17:
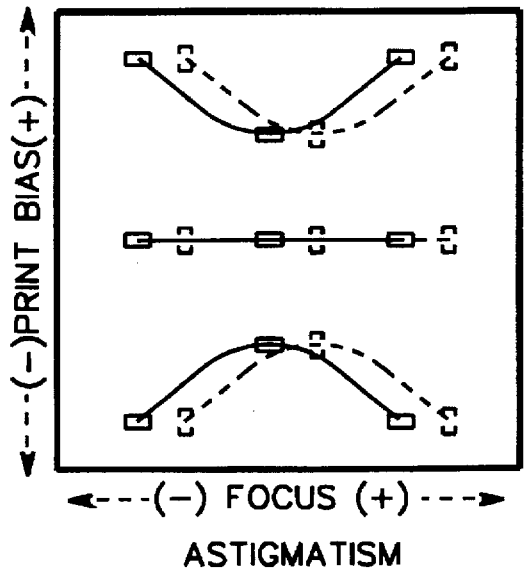
FIG. 17 is a plot of print bias vs. focus setting at several different exposures for both a horizontal and a vertical isolated edge showing lithographic astigmatism.

FIG. 17 depicts the case where an lithographic astigmatism is present in the lithographic system, shown by displacement along the focus axis of the vertical edge (dotted lines) curves from the horizontal (solid lines) edge curves. Lithographic astigmatism in the present embodiment is where the best focus for each of the vertical and horizontal isolated edges does not coincide. Where an lithographic astigmatism is found, it can be corrected, at least to some extent, by altering the lithographic system focus setting, based on the difference between the best focus for the horizontal and vertical edge curves.

Figure 18:
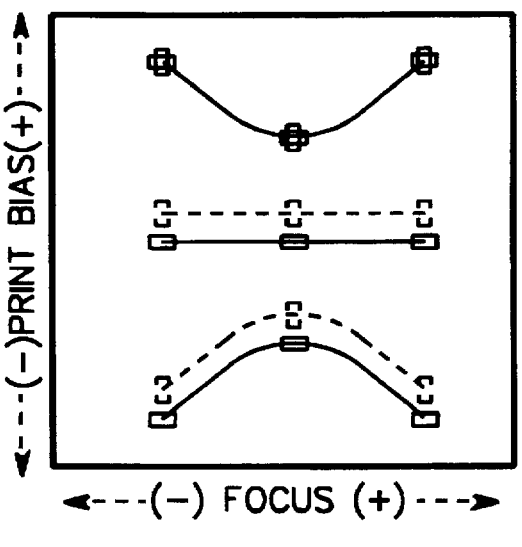
FIG. 18 is a plot similar to that of FIGS. 16 and 17, showing the presence of lithographic coma.

FIG. 18 depicts a situation of lithographic coma; that is, where the horizontal and vertical isolated edges tend to become different sizes from one another with variations in exposure. In FIG. 18, this is shown by less than all the curves for the vertical isolated edge (dotted lines) and the curves for the horizontal isolated edge (solid lines) being displaced vertically from one another. Where lithographic coma is found in a lithographic system, it can be corrected, at least to some extent, by adjustments to the lithographic system, such as the lens in FIG. 3.

Figure 19:
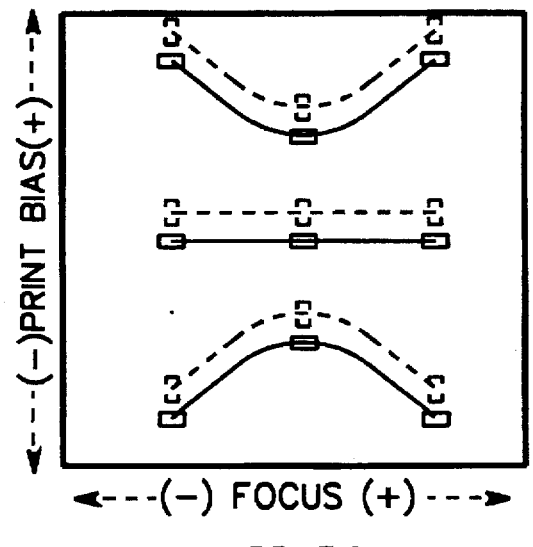
FIG. 19 is a plot similar to that of FIGS. 16, 17 and 18, showing a case of vibration.

FIG. 19 depicts the situation of vibration in the lithographic system; that is, micromovements occurring during imaging, causing smearing of the projected image during imaging which causes displacement of the horizontal and vertical isolated edges. Note also that the slope of the resulting image profile will degrade. In FIG. 18, vibration is identified by all the vertical isolated edge curves (dotted lines) being displaced horizontally from the horizontal isolated edge curves (solid lines). Vibration in the lithographic system can be corrected for by determining the cause of the vibrations and controlling same. Once it is determined that one or more aberrations exist, the lithographic system and/or the environment could be adjusted, using the aberration information in a feedback manner.

Figure 20:
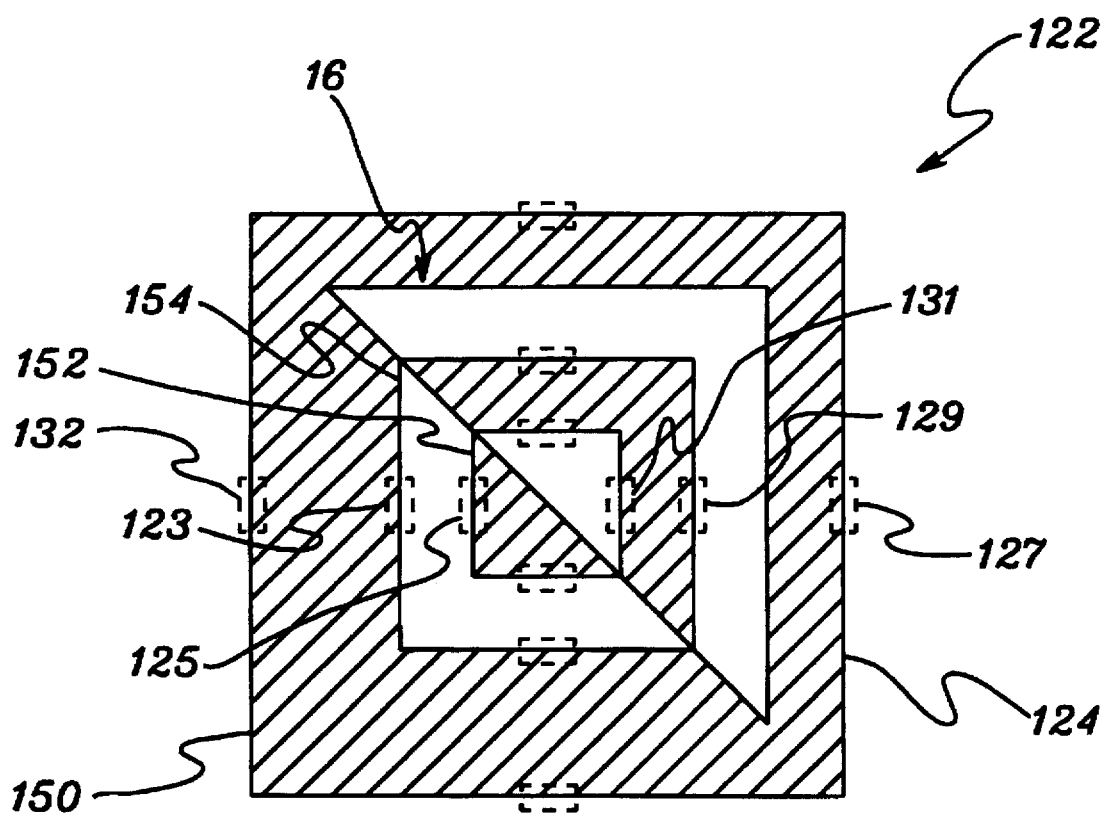
FIG. 20 depicts an overlay target according to the present invention.

The print bias target of the present invention is useful not only for providing print bias information, leading to various other information regarding the lithography system, but also for overlay. FIG. 20 depicts an overlay target 122 according to the present invention. Overlay target 122 comprises an overlay box 124 at a lower level on top of which is imaged print bias target 16 at a second lithographic level. Utilizing the print bias target of the present invention along with the lower level overlay box provides the necessary overlay information without going to a different tool than required for the print bias information, saving time and money. In general, the results of the present overlay procedure provide data for controlling the imaging process. This procedure is based on the overlay procedure already existing today and which was described with reference to FIG. 1.

In contrast to the current overlay process, the overlay method of the present invention focuses on comparing the center of the lower level image with that of an average center of the upper level print bias target. As exposure and/or focus vary, the position of the outer isolated edge 154 of print bias target 16 may change relative to inner isolated edge 152, however, the mid-point between isolated edges 154 and 152 with respect to outer box isolated edge 150 does not change, since edges 152 and 154 are isolated edges of differing image structure and therefore counteract each other. Note that this is true so long as the print bias target as a whole is within outer box 124.

Isolated edge detection windows, e.g., detection window 132, are the areas in overlay target 122 where the overlay measurement system searches for an isolated edge. An example of the determination of overlay for overlay target 122 will now be given. The example will focus on determining the X overlay coordinate with it being understood that the Y overlay coordinate is determined in a similar fashion. The X coordinate center of lower level image 124 is determined by adding the measurement for the isolated edge in detection window 132 to the measurement for the isolated edge in detection window 127 and dividing the sum by 2. The average center of print bias target 16 is found by first finding the midpoint between the isolated edges within detection windows 123 and 125. This is, of course, merely an average of the measurements for those isolated edges. Similarly, the midpoint is found between isolated edges found within detection windows 129 and 131. Once the midpoints are found, they are considered to be the X coordinate edges of the upper level image. As such, the midpoints are added together and divided by 2 to find the X coordinate of the average centers of print bias target 16. The X overlay coordinate is then found by subtracting the X coordinate for the average center of print bias target 16 from the X coordinate center of lower level image 124.

Figure 21:
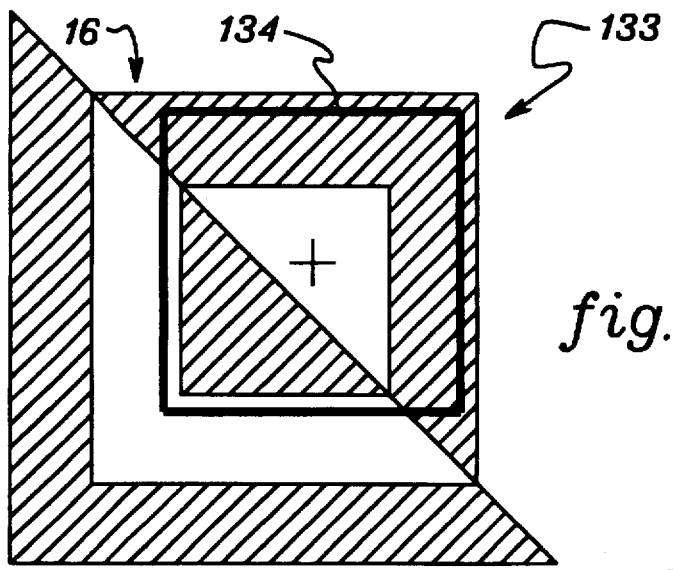
FIG. 21 depicts an overlay target according to the present invention where the prior level image is physically smaller than that of the print bias target imaged thereover.
Figure 22:
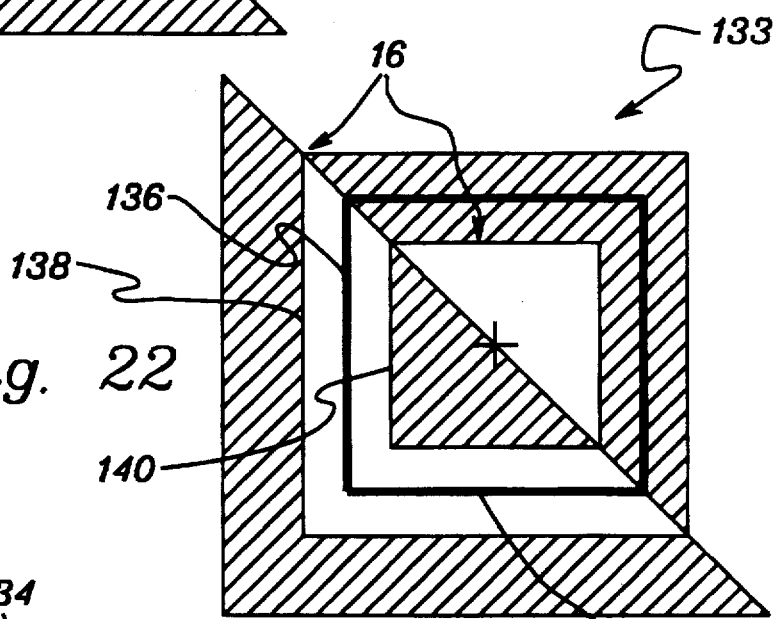
FIG. 22 depicts the overlay target of FIG. 21 under conditions of perfect overlay.
Figure 23:
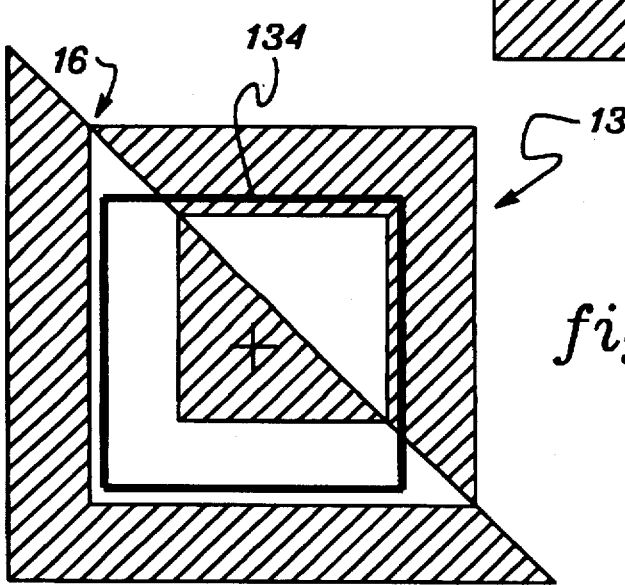
FIG. 23 depicts the overlay target of FIGS. 21 and 22 under a different condition of non-ideal overlay.

In addition to imaging print bias target 16 over a larger lower level image to obtain the overlay target, the lower level image could be physically smaller than the print bias target image. Note, however, that one should avoid imaging the edges of the print bias target in close proximity to the edges of the lower-level image. One should also strive to keep the print bias target within it topography. FIG. 22 depicts overlay target 133 comprising print bias target 16 which has been imaged on top of lower level image 134, the outline of which is visible in FIG. 22. Overlay is determined in the same manner as described with respect to FIG. 19. In this case, overlay target 16 is centered on top of lower level image 134; therefore, the overlay coordinates would be (0,0). FIG. 21 depicts a situation where print bias target 16 is not centered on top of lower level image 134. Lower level image 134 appears to be up and to the right of the center of print bias target 16, producing negative overlay coordinates. The opposite situation (positive overlay coordinates) is depicted in FIG. 23.

Figure 24:
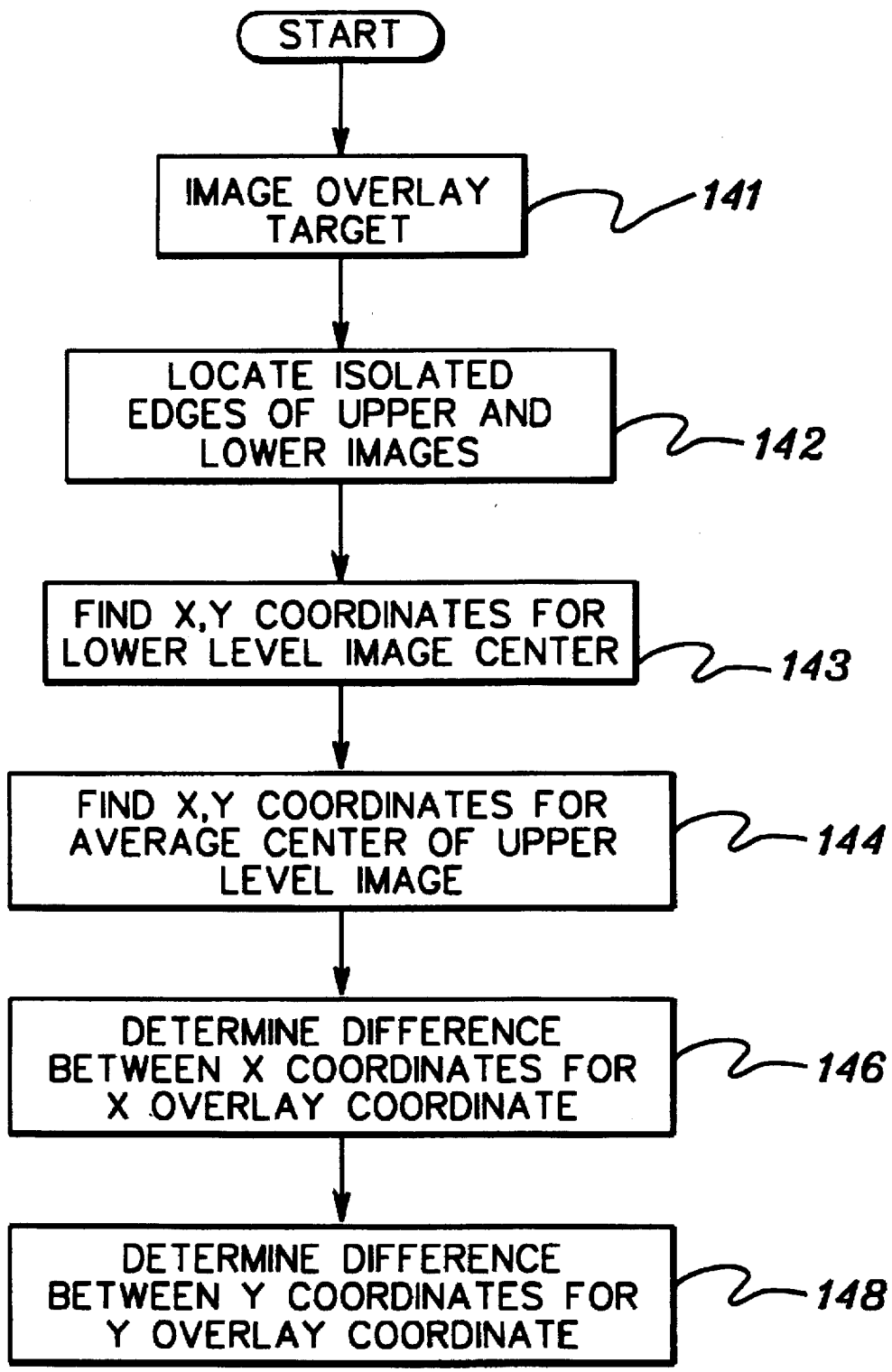
FIG. 24 is a flow diagram of a method for determining overlay in a lithographic system according to the present invention.

FIG. 24 is a flow diagram of a method for determining overlay in a lithographic system according to the present invention. The method begins by imaging the overlay target (STEP 141, "IMAGE OVERLAY TARGET"). Imaging the overlay target comprises imaging the lower level image, and then imaging the print bias target on top thereof in accordance with the present invention. After imaging the overlay target, the isolated edges of the upper and lower images are located (STEP 142, "LOCATE ISOLATED EDGES OF UPPER AND LOWER IMAGES"). With reference to FIG. 20, STEP 142 is accomplished by searching for the isolated edges in the isolated edge detection windows (e.g., window 132). After locating the isolated edges of the overlay target, the X and Y coordinates for the lower level image center are determined (STEP 143, "FIND X,Y COORDINATES FOR LOWER LEVEL IMAGE CENTER"). The X,Y coordinate for the average center of the upper level image, i.e., the print bias target, is also determined (STEP 144, "FIND X,Y COORDINATES FOR AVERAGE CENTER OF UPPER LEVEL IMAGE"). After the X and Y coordinates of the lower level image center and upper level image average center are determined, the difference between the corresponding coordinates is determined in order to obtain the overlay coordinate result (STEP 146, "DETERMINE DIFFERENCE BETWEEN X COORDINATES FOR X OVERLAY COORDINATE"; and STEP 148, "DETERMINE DIFFERENCE BETWEEN Y COORDINATES FOR Y OVERLAY COORDINATE"). From the results of the overlay determination, the registration of the print bias target with respect to the lower level image is found. The resultant overlay coordinate may then be compared to tolerances specified in a given situation to determine whether the overlay is within acceptable parameters.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. A mask comprising a design image for imaging a print bias target in a single layer of light-sensitive material for determining print bias in a lithographic system, said design image comprising a plurality of target regions, each of said plurality of target regions having an image structure different from that of each other of said plurality of target regions immediately adjacent thereto, said plurality of target regions forming a plurality of isolated edges in said print bias target, wherein said design image comprises a binary design image, wherein said plurality of target regions comprise a first region having a positive polarity image structure and a second region having a negative polarity image structure, wherein said plurality of target regions comprises a first L-shaped region of a first polarity, a second triangular-shaped region of a second polarity immediately adjacent to said first L-shaped region, a third triangular-shaped region of said first polarity immediately adjacent to said second triangular-shaped region, a fourth L-shaped region of said second polarity immediately adjacent to said third triangular-shaped region and a fifth L-shaped region of said first polarity immediately adjacent to said fourth L-shaped region.

* * * * *